(12) United States Patent  
Chae (10) Patent No.: US 9,196,665 B2  
(45) Date of Patent: Nov. 24, 2015

(54) DISPLAY DEVICE AND METHOD FOR MANUFACTURING THE SAME

(71) Applicant: Samsung Display Co., Ltd., Yongin, Gyeonggi-do (KR)

(72) Inventor: Jong-Won Chae, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/321,574

(22) Filed: Jul. 1, 2014

(65) Prior Publication Data

US 2015/0171151 A1 Jun. 18, 2015

(30) Foreign Application Priority Data

Dec. 16, 2013 (KR) ........................ 10-2013-0156140

(51) Int. Cl.
| | |
|---|---|
| *H01L 51/54* | (2006.01) |
| *H01L 29/00* | (2006.01) |
| *H01L 27/32* | (2006.01) |
| *H01L 27/12* | (2006.01) |

(52) U.S. Cl.
CPC .......... *H01L 27/3262* (2013.01); *H01L 27/124* (2013.01); *H01L 27/1259* (2013.01)

(58) Field of Classification Search
CPC ............ H01L 27/3262; H01L 27/1259; H01L 27/124; H01L 31/03762; H01L 31/02327
USPC .......... 257/40, 59, 75, 99, E27.111, E27.119, 257/E51.018; 313/586; 349/40, 42, 153; 438/34, 151, 158
See application file for complete search history.

(56) References Cited

U.S. PATENT DOCUMENTS

| | | | | |
|---|---|---|---|---|
| 7,439,539 | B2* | 10/2008 | Jeoung et al. | 257/59 |
| 8,289,457 | B2* | 10/2012 | Hwang et al. | 349/12 |
| 2003/0123016 | A1* | 7/2003 | Kim | 349/153 |
| 2008/0084162 | A1 | 4/2008 | Kim | |
| 2010/0165226 | A1* | 7/2010 | Lee et al. | 349/40 |
| 2012/0104395 | A1* | 5/2012 | Kim et al. | 257/59 |

FOREIGN PATENT DOCUMENTS

| | | |
|---|---|---|
| KR | 10-0264162 B1 | 5/2000 |
| KR | 10-2007-0056837 A | 6/2007 |
| KR | 10-2008-0004781 A | 1/2008 |
| KR | 10-0813845 B1 | 3/2008 |

* cited by examiner

*Primary Examiner* — Dao H Nguyen  
(74) *Attorney, Agent, or Firm* — Knobbe, Martens, Olson & Bear, LLP

(57) ABSTRACT

A display device and method for manufacturing the same are disclosed. In one aspect, the display device includes a substrate including a display area and a pad area, a semiconductor layer formed over the substrate, and an insulating layer formed over the semiconductor layer. The display device also includes a metal wire formed over the insulating layer in the display area and a pad electrode formed over the insulating layer in the pad area, wherein the pad electrode is electrically connected to the metal wire. The display device further includes a pattern formed between an edge of the substrate and an end portion of the pad electrode. The edge of the substrate is adjacent to the pad electrodes and the pattern is spaced apart from the end portion of the pad electrode.

15 Claims, 6 Drawing Sheets

DISPLAY DEVICE AND METHOD FOR MANUFACTURING THE SAME

CROSS-REFERENCE TO RELATED APPLICATIONS

This application claims priority to and the benefit of Korean Patent Application No. 10-2013-0156140, filed on Dec. 16, 2013, with the Korean Intellectual Property Office, the disclosure of which is incorporated herein in its entirety by reference.

BACKGROUND

1. Field

The described technology generally relates to a display device including a pattern on a pad area and to a manufacturing method thereof.

2. Description of the Related Technology

Flat panel displays (FPDs) such as liquid crystal displays (LCDs) and organic light-emitting diode (OLED) displays include a pair of electric field generating electrodes and an electro-optical active layer interposed therebetween. A liquid crystal layer is included as the electro-optical active layer in LCDs and an organic light-emitting layer is included as the electro-optical active layer in OLED displays.

One of the electrodes is connected to a switching element so as to receive an electrical signal. The electro-optical active layer converts the electrical signal into an optical signal so that an image is displayed.

SUMMARY OF CERTAIN INVENTIVE ASPECTS

One inventive aspect is a display device including a pattern on an end portion of a pad area, the pattern being configured to substantially prevent side moisture penetration and a lifting phenomenon of a protective layer, and a method of manufacturing the display device.

Another aspect is a display device including a substrate including a display area and a pad area, a semiconductor layer formed on the substrate, an insulating layer formed on the semiconductor layer, a metal wire formed on the insulating layer of the display area, a pad electrode formed on the insulating layer of the pad area, the pad electrode being connected to the metal wire, and a pattern spaced apart from an end portion of the pad electrode of the pad area.

The pattern may be formed on the insulating layer.

The display device may further include a protective layer on the metal wire and the pad electrode, the protective layer being configured to cover a part of the pattern.

The metal wire, the pad electrode, and the pattern may be formed on the same layer.

The protective layer may have a contact hole configured to expose the pad electrode.

The display device may further include a driver formed on the protective layer, which is connected to the pad electrode through the contact hole, and an anisotropic conductive film (ACF) formed between the protective layer and the driver.

The pattern may be formed on the same layer as the semiconductor layer.

The insulating layer may include a protrusion on an area corresponding to the pattern.

The display device may further include a protective layer formed on the metal wire and the pad electrode, which is configured to cover a part of the protrusion.

The pattern may have a line shape.

The pattern may extend along a side of the pad area.

The metal wire may be a source electrode, a drain electrode, a storage electrode, or a data line.

Another aspect is a method of manufacturing a display device including preparing a substrate including a display area and a pad area, forming a semiconductor layer on the substrate, forming a gate insulating layer on the semiconductor layer, forming a gate electrode and a gate line on the gate insulating layer, forming an insulating layer on the gate electrode and the gate line, forming a source electrode, a drain electrode, and a data line on the insulating layer of the display area, and forming a pad electrode and a pattern on the insulating layer of the pad area, and forming a protective layer on the source electrode, the drain electrode, and the data line.

In the forming of the protective layer, the protective layer may cover a part of the pattern.

In the forming of the pattern, the pattern may be formed to be spaced apart from an end portion of the pad electrode.

Another aspect is a method of manufacturing a display device including preparing a substrate including a display area and a pad area, forming a semiconductor layer on the display area of the substrate, and forming a pattern on the pad area of the substrate, forming a gate insulating layer on the semiconductor layer, forming a gate electrode and a gate line on the gate insulating layer, forming an insulating layer on the gate electrode and the gate line, forming a source electrode, a drain electrode, and a data line on the insulating layer of the display area, and forming a pad electrode on the insulating layer of the pad area, and forming a protective layer on the source electrode, the drain electrode, and the data line.

Another aspect is a display device including a substrate including a display area and a pad area, a semiconductor layer formed over the substrate, an insulating layer formed over the semiconductor layer, a metal wire formed over the insulating layer in the display area, a pad electrode formed over the insulating layer in the pad area, wherein the pad electrode is electrically connected to the metal wire, and a pattern formed between an edge of the substrate and an end portion of the pad electrode, wherein the edge of the substrate is adjacent to the pad electrodes, and wherein the pattern is spaced apart from the end portion of the pad electrode.

The pattern is formed on the insulating layer. The display device further includes a protective layer formed over the metal wire and the pad electrode, wherein the protective layer covers at least a portion of the pattern. The metal wire, the pad electrode, and the pattern are formed on the same layer. The protective layer has a contact hole at least partially overlapping the pad electrode. The display device further includes a pixel circuit, a driver formed over the protective layer and electrically connected to the pad electrode via the contact hole, wherein the driver is configured to drive the pixel circuit, and an anisotropic conductive film interposed between the protective layer and the driver. The pattern and the semiconductor layer are formed on the same layer. The insulating layer includes a protrusion in an area overlapping the pattern. The display device further includes a protective layer formed over the metal wire and the pad electrode, wherein the protective layer covers a portion of the protrusion. The pattern has a substantially line shape. The pattern extends along the edge of the substrate. The metal wire includes one or more of a source electrode, a drain electrode, a storage electrode, and a data line.

Another aspect is a method of manufacturing a display device, the method including providing a substrate including a display area and a pad area, forming a semiconductor layer over the substrate, forming a gate insulating layer over the semiconductor layer, forming a gate electrode and a gate line over the gate insulating layer, forming an insulating layer over the gate electrode and the gate line, forming a source electrode, a drain electrode, and a data line over the insulating layer in the display area, forming a pad electrode and a pattern over the insulating layer in the pad area, wherein the pattern is interposed between the pad electrode and an edge of the substrate and wherein the edge of the substrate is adjacent to the pad electrode, and forming a protective layer over the source electrode, the drain electrode, and the data line.

The protective layer covers a portion of the pattern. The pattern is spaced apart from an end portion of the pad electrode.

Another aspect is a method of manufacturing a display device, the method including providing a substrate including a display area and a pad area, forming a semiconductor layer in the display area of the substrate, forming a pattern in the pad area of the substrate, forming a gate insulating layer over the semiconductor layer, forming a gate electrode and a gate line over the gate insulating layer, forming an insulating layer over the gate electrode and the gate line, forming a source electrode, a drain electrode, and a data line over the insulating layer in the display area, forming a pad electrode over the insulating layer in the pad area, wherein the pattern is closer to an edge of the substrate than the pad electrode and wherein the edge of the substrate is adjacent to the pad electrode, and forming a protective layer over the source electrode, the drain electrode, and the data line.

The protective layer is formed over a portion of the pad electrode so as to expose the pad electrode and wherein the protective layer at least partially overlaps the pattern.

Another aspect is an organic light-emitting diode (OLED) display including a substrate including a display area and a pad area, a plurality of pixels formed in the display area, each pixel including a thin film transistor (TFT) and an OLED, an insulating layer formed in the display area and the pad area, a plurality of pad electrodes formed over the insulating layer in the pad area and electrically connected to the TFTs, and a spacer formed closer to an edge of the substrate than the pad electrodes, wherein the edge of the substrate is adjacent to the pad electrodes.

The insulating layer is formed over the spacer so as to form a protrusion in the insulating layer. The spacer has a substantially line shape.

According to at least one embodiment, the display device may prevent bubbles from being formed between the insulating layer and the anisotropic conductive film, lifting of the protective layer, and moisture penetration into the end portion of the pad area.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION OF CERTAIN INVENTIVE EMBODIMENTS

Flat panel displays include a display area that displays images and a non-display area adjacent to and surrounding the display area on one substrate. Pixels including thin film transistors (TFTs) are arranged in the display area and pad electrodes configured to transmit electrical signals received from a driving circuit to a pixel area are formed on a pad area in the non-display area.

Different configurations for connecting the pad area to an external circuit can be employed. Examples of such configurations include a flexible printed circuit (FPC), chip on glass (COG), or tape carrier package (TCP) which are applied to the pad area. An FPC is connected to the pad electrode by an adhesive such as anisotropic conductive film (ACF).

A protective layer is formed to cover the pad electrode in the pad area and is not formed on an end portion of the pad area in order to ensure separation of display cells when they are cut from a mother substrate. However, when the protective layer is not formed on the end portion, moisture more easily penetrates through the end portion and the protective layer can be lifted off of the substrate.

Advantages and features of the described technology and methods for achieving them will be made clear from the embodiments described in detail below with reference to the accompanying drawings. The described technology may, however, be embodied in many different forms and should not be construed as being limited to the embodiments set forth herein. Rather, these embodiments are provided so that this disclosure will be thorough and complete, and will fully convey the scope of the described technology to those skilled in the art. The described technology is merely defined by the scope of the claims. Therefore, well-known constituent elements, operations and techniques are not described in detail in the embodiments in order to prevent the described technology from being obscurely interpreted. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, when a device shown in the drawings is turned over, the component positioned "below" or "beneath" another component in the drawings is then located "above" the other component. Accordingly, the illustrative term "below" may include both the lower and upper positions. The device may also be oriented in the other direction, and thus the spatially relative terms are to be interpreted differently depending on the orientations. As used herein, the term "connected" includes "electrically connected."

The terminology used herein is for the purpose of describing particular embodiments only and is not construed as limiting the described technology. As used herein, the singular forms "a," "an" and "the" are intended to include the plural forms as well, unless the context clearly indicates otherwise.

It will be further understood that the terms "comprises" and/or "comprising," when used in this specification, specify the presence of mentioned component, step, operation and/or element, but do not exclude the presence or addition of one or more other components, steps, operations and/or elements.

Unless otherwise defined, all terms used herein (including technical and scientific terms) have the same meaning as commonly understood by those skilled in the art to which the described technology pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a display device according to an embodiment will be described in detail with reference to FIGS. 1 to 4. Depending on the embodiment, the display device includes a liquid crystal display (LCD) or an organic light-emitting diode (OLED) display. Hereinafter, the display device is described as an OLED display.

Figure 1:
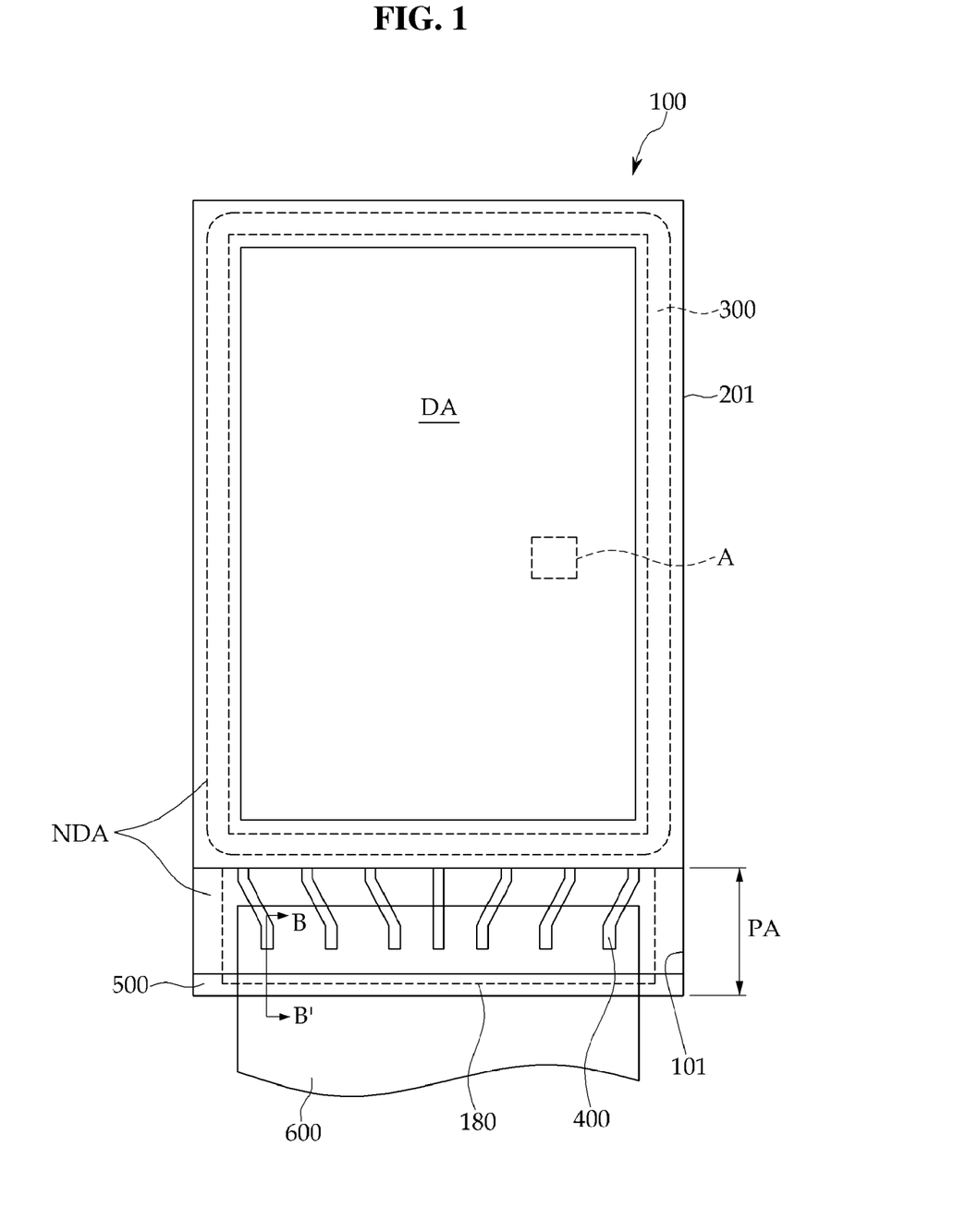
FIG. 1 is a schematic plan view illustrating a display device according to an embodiment.

Referring to FIG. 1, the OLED display 100 includes a substrate 101, an encapsulation substrate 201, and a sealing member 300, but the described technology is not limited thereto. A substrate body 111 may be encapsulated by an encapsulation film other than the illustrated encapsulation substrate 201.

The substrate 101 includes a display area DA that displays images via light emission and a non-display area NDA surrounding the display area DA. An OLED, a thin film transistor (TFT) configured to drive the OLED, and a wire are formed in the display area DA. The non-display area NDA includes a pad area PA where a plurality of pad electrodes 400 are formed. The pad electrodes 400 receive external signals and transmit the received signals to drive the OLED to emit light.

The display area DA and the pad area PA will be described in detail below with reference to FIGS. 2 and 3.

In the accompanying drawings, the OLED display is illustrated as an active matrix (AM) OLED display having a 2Tr-1Cap structure including two thin film transistors (TFTs) 10 and 20 and one capacitor 80 in each pixel of the display area corresponding to "DA" shown in FIG. 1, but embodiments of the described technology are not limited thereto.

Thus, in other embodiments, the OLED display includes three or more TFTs and/or two or more capacitors in each pixel and has various structures including additional wires that are not illustrated. As used herein, a pixel refers to the smallest unit that displays an image and the display area DA displays images via a plurality of pixels.

Figure 2:
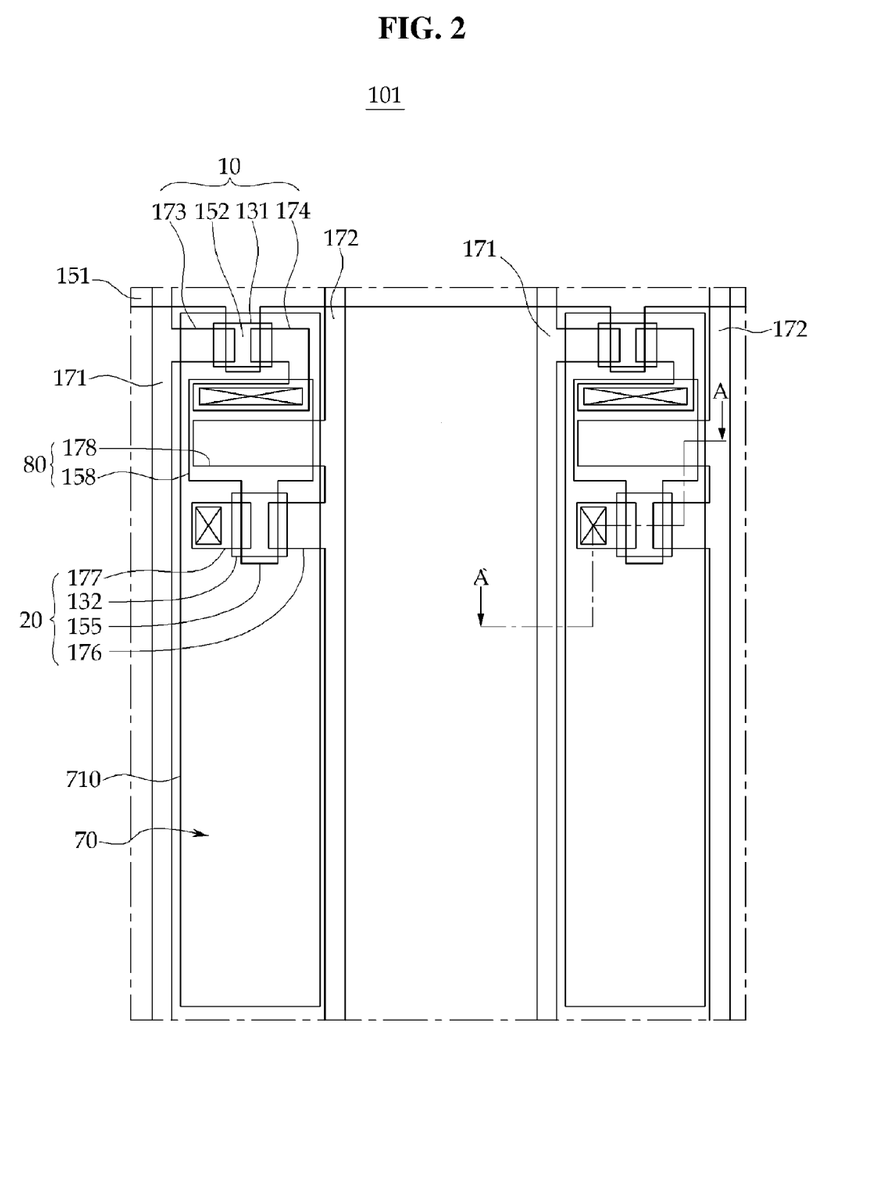
FIG. 2 is an enlarged plan view of the portion A of FIG. 1.
Figure 3:
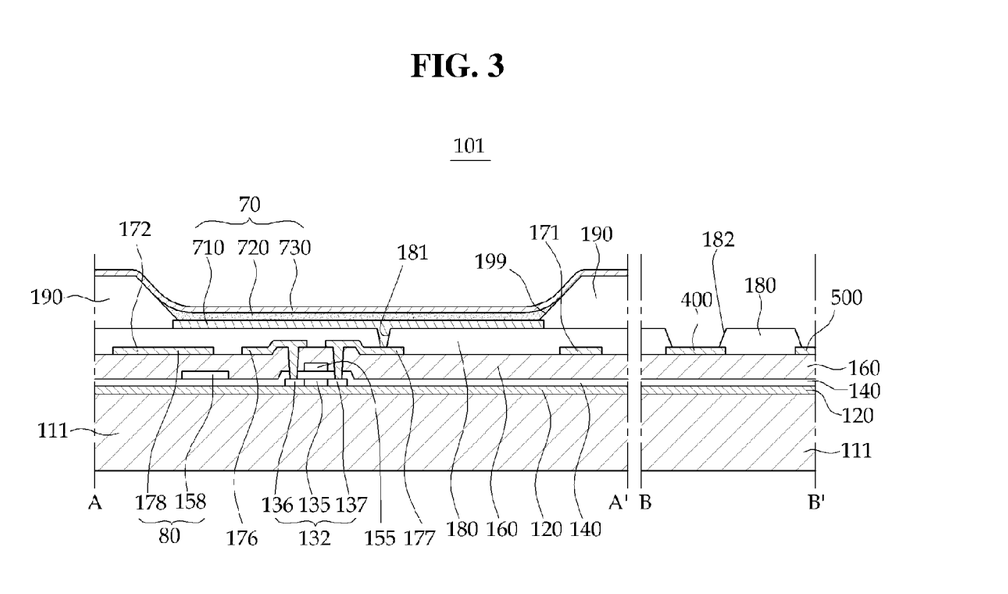
FIG. 3 is a cross-sectional view showing a display area, taken along line A-A' of FIG. 2, and a pad area, taken along line B-B' of FIG. 1 according to an embodiment.

Referring to FIGS. 2 and 3, the substrate 101 includes a switching TFT 10, a driving TFT 20, a capacitor 80, and an OLED 70 in each pixel included in the substrate body 111. The substrate 101 further includes a gate line 151 extending in one direction, a data line 171 and a common power source line 172 that are insulated from each other and cross the gate line 151.

Each pixel area is defined by the intersection between gate line 151, the data line 171, and the common power source line 172, however, the described technology is not limited thereto.

The OLED 70 includes a pixel electrode 710, an organic light-emitting layer 720 on the pixel electrode 710, and a common electrode 730 on the organic light-emitting layer 720. One or more pixel electrode 710 is formed in each pixel and thus the substrate 101 includes a plurality of pixel electrodes 710 spaced apart from each other.

In some embodiments, the pixel electrode 710 is an anode which is a hole injection electrode and the common electrode 730 is a cathode which is an electron injection electrode. However, the described technology is not limited thereto, and in other embodiments the pixel electrode 710 is the cathode and the common electrode 730 is the anode.

Holes and electrons injected into the organic light-emitting layer 720 are recombined with each other to form an exciton and light is emitted when the exciton decays from an excited state to a ground state.

The capacitor 80 includes a pair of storage electrodes 158 and 178 with an insulating layer 160 interposed therebetween. The insulating layer 160 is a dielectric. The capacitance of the capacitor 80 is determined by the electric charge stored in the capacitor 80 and the voltage between the pair of storage electrodes 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 is used as a switching element configured to select a desired pixel to emit light. The switching gate electrode 152 is connected to the gate line 151. The switching source electrode 173 is connected to the data line 171. The switching drain electrode 174 is spaced apart from the switching source electrode 173 and is connected to the first storage electrode 158.

The driving TFT 20 applies driving power to the pixel electrode 710 so that the organic light-emitting layer 720 of the OLED 70 in a selected pixel emits light. The driving gate electrode 155 is connected to the first storage electrode 158 that is connected to the switching drain electrode 174. The driving source electrode 176 and the second storage electrode 178 are connected to the common power source line 172.

The driving drain electrode 177 is connected to the pixel electrode 710 of the OLED 70 through a first contact hole 181.

With the above-described structure, the switching TFT 10 is operated by a gate voltage applied to the gate line 151 so as to transmit a data voltage received from the data line 171 to the driving TFT 20.

A voltage equivalent to the difference between a common voltage applied from the common power source line 172 to the driving TFT 20 and the data voltage transmitted from the switching TFT 10 and stored in the capacitor 80 is applied to the OLED. Additionally, a current corresponding to the voltage stored in the capacitor 80 flows to the OLED 70 through the driving TFT 20 such that the OLED 70 emits light.

The display area DA and the pad area PA will be described below in greater detail with reference to FIGS. 2 and 3.

The OLED 70, the driving TFT 20, the capacitor 80, the data line 171, and the common power source line 172 illustrated in FIG. 3 will be described below. The switching semiconductor layer 131, the switching gate electrode 152, the switching source electrode 173, and the switching drain electrode 174 of the switching TFT 10 respectively have substantially the same laminated structure as the driving semiconductor layer 132, the driving gate electrode 155, the driving source electrode 176, and the driving drain electrode 177 of the driving TFT 20 and thus further description thereof will not be provided.

The substrate body 111 may include an insulating substrate formed of glass, quartz, ceramic, or plastic. However, the described technology is not limited thereto and the substrate body 111 may also include a metal substrate formed of stainless steel, or the like.

A buffer layer 120 is formed on the substrate body 111. The buffer layer 120 planarizes the top surface of the substrate body and acts to block the penetration of undesirable elements such as impurities. The buffer layer 120 may include various materials to achieve the above functions. For instance, the buffer layer 120 may include one or more material selected from the group of silicon nitride (SiNx), silicon oxide (SiO2), and silicon oxynitride (SiOxNy). However, the buffer layer 120 is not necessary in every embodiment and may be omitted based on the configuration or material of the substrate body 111 and process conditions thereof.

The driving semiconductor layer 132 is formed on the buffer layer 120 in the display area DA. The driving semiconductor layer 132 includes one or more semiconductor material selected from the group of polycrystalline silicon, amorphous silicon, and oxide semiconductor. Further, the driving semiconductor layer 132 includes a channel area 135 that is not doped with impurities, and in some embodiments, p-doped source and drain areas 136 and 137 on opposing sides of the channel area 135. In these embodiments, p-type impurities such as boron B are used as dopant ions, and for example, $B_2H_6$ can be used as a dopant. Herein, the specific impurities used vary depending on the configuration of the TFT. In other embodiments, the source and drain areas 136 and 137 are n-doped.

A gate insulating layer 140 including silicon nitride or silicon oxide is formed on the driving semiconductor layer 132. The gate insulating layer 140 may include one or more material selected from the group of tetraethyl orthosilicate (TEOS), silicon nitride (SiNx), and silicon oxide ($SiO_2$). For example, the gate insulating layer 140 may have a double layer structure in which a silicon nitride layer having a thickness of about 40 nm and a tetraethyl orthosilicate layer having a thickness of about 80 nm are sequentially laminated, but the structure and thickness of the gate insulating layer 140 is not limited thereto.

The driving gate electrode 155, the gate line 151, and the first storage electrode 158 are formed on the gate insulating layer 140. The driving gate electrode 155 overlaps at least a part of the driving semiconductor layer 132, namely the channel area 135. The driving gate electrode 155 substantially prevents the channel area 135 from being doped with impurities when the source and drain areas 136 and 137 of the driving semiconductor layer 132 are doped.

The gate electrode 155 and the first storage electrode 158 are formed on the same layer and are formed of the same metal material. The material may include one or more material selected from the group of molybdenum (Mo), chromium (Cr), and tungsten (W). In some embodiments, the gate electrode 155 and the first storage electrode 158 are formed of molybdenum (Mo) or molybdenum alloys.

The insulating layer 160 covers the driving gate electrode 155 and is formed on the gate insulating layer 140. The insulating layer 160 may be an interlayer insulating layer. The insulating layer 160 may be formed of silicon nitride or silicon oxide in the same way as the gate insulating layer 140. The gate insulating layer 140 and the insulating layer 160 have contact holes exposing the source area 136 and the drain area 137 of the driving semiconductor layer 132.

The driving source electrode 176, the driving drain electrode 177, the data line 171, the power source line 172, and the second storage electrode 178 are formed on the insulating layer 160 in the display area DA. The driving source electrode 176 and the driving drain electrode 177 are respectively connected to the source area 136 and the drain area 137 of the driving semiconductor layer 132 through the contact holes.

In detail, the driving source electrode 176, the driving drain electrode 177, the data line 171, the common power source line 172, and the second storage electrode 178 may be formed of refractory metals including one or more material selected from the group of molybdenum, chromium, tantalum and titanium, or alloys thereof, and may have a multilayer structure in which a refractory metal layer and a low resistance conductive layer are included. The multilayer structure may include, for example, a double layer consisting of a chromium or molybdenum (or alloys thereof) lower layer and an aluminum (or alloys thereof) upper layer, and a triple layer consisting of a molybdenum (or alloys thereof) lower layer, an aluminum (or alloys thereof) intermediate layer, and a molybdenum (or alloys thereof) upper layer.

The driving source electrode 176, the driving drain electrode 177, the data line 171, the common power source line 172, and the second storage electrode 178 may be formed of many different conductive materials besides the above-described materials.

Accordingly, the driving TFT 20 includes the driving semiconductor layer 132, the driving gate electrode 155, the driving source electrode 176, and the driving drain electrode 177 and is formed in the display area DA. The structure of the driving TFT 20 is not limited thereto, and may be configured in various ways.

A plurality of pad electrodes 400 are formed on the insulating layer 160 in the pad area PA. The pad electrodes 400 may be formed by the same process as the driving source electrode 176, the driving drain electrode 177 and the like in the display area DA, and may be formed of the same material and on the same layer.

A pattern or spacer 500 is formed on the insulating layer and is separated at a predetermined distance from end portions of the pad electrodes 400. The pattern 500 may be formed by the same process as the pad electrode 400 in the pad area PA and the driving source electrode 176, the driving drain electrode 177, and the like in the display area DA, and may be formed of the same material and on the same layer.

According to some embodiments, the pattern 500 has a line shape. The pattern 500 extends across the ends the pad electrodes 400, namely along a lower part of the pad area PA as illustrated in FIG. 1. The pattern 500 is spaced apart from the end portions of the pad electrodes 400 and extends substantially parallel to an imaginary line connecting the end portions of the pad electrodes 400 on a side surface of the pad area PA. Referring to FIG. 1, the pattern 500 extends substantially linearly along the entire lower portion of the pad area PA. The pattern 500 is formed to have the same height as the pad electrode 400 in the pad area PA and the driving source electrode 176, the driving drain electrode 177, and the like in the display area DA.

A protective layer 180 covers the driving source electrode 176, the driving drain electrode 177, and the pad electrode 400 and is formed on the insulating layer 160. The protective layer 180 may be formed of an organic material such as polyacryl, polyimide, or the like. The protective layer 180 may be a planarization layer.

The protective layer 180 may be formed of one or more material selected from the group of polyacrylate resin, epoxy resin, phenolic resin, polyamide resin, polyimide resin, unsaturated polyester resin, polyphenylene ether resin, polyphenylene sulfide resin, and benzocyclobutene (BCB).

The protective layer 180 has a first contact hole 181 exposing the driving drain electrode 177 and a second contact hole 182 exposing the pad electrode 400.

According to the embodiment, the protective layer 180 covers a portion of the pattern 500 or is formed only between the pattern 500 and the pad electrode 400. Thus, the protective layer 180 is not necessarily formed on the pattern 500.

When the pattern 500 is not formed in the display device, the protective layer forms a step on the insulating layer 160 at the end of the device, thereby generating a weak point where moisture can penetrate through the side of the protective layer 180 and a lifting phenomenon separating the protective layer 180 from the insulating layer 160.

However, according to at least one embodiment, the penetration of moisture through the side of the display and the lifting of the protective layer 180 are substantially prevented due to the structure of the protective layer 180 and/or the pattern 500 described above.

Referring back to FIGS. 3 and 4, the pixel electrode 710 is formed on the protective layer 180 in the display area DA and the pixel electrode 710 is connected to the driving drain electrode 177 through the first contact hole 181 in the protective layer 180.

Figure 4:
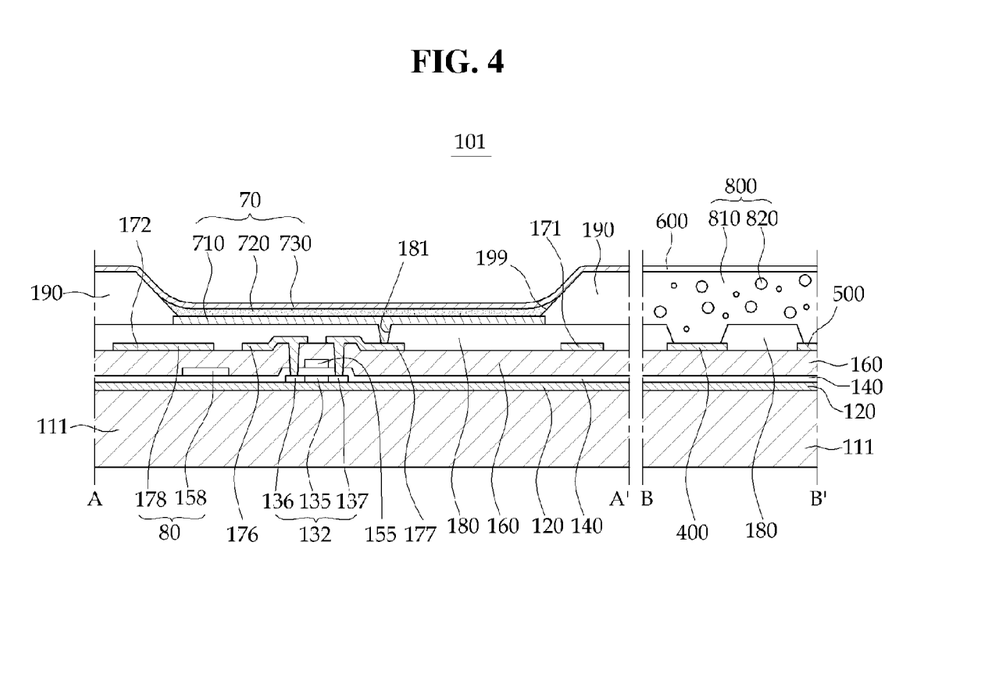
FIG. 4 is cross-sectional views showing an anisotropic conductive film and a driver together with the display device of FIG. 3.

A conductive adhesive member 800 is formed on the pad electrode 400 exposed by the second contact hole 182 in the protective layer 180 in the pad area PA.

The conductive adhesive member 800 includes an insulating adhesive material 810 and conductive particles 820. The insulating adhesive material 810 is cured by light and heat so as to bond a driver 600 to the substrate 101. The conductive particles 820 are dispersed in the insulating adhesive material 810 so as to electrically connect the driver 600 to the pad electrode 400. The conductive adhesive member 800 may include, for example, an anisotropic conductive film (ACF). The driver 600 may include, for example, flexible printed circuit connected to an external circuit substrate so as to transmit external signals, chip on glass (COG), or tape carrier package (TCP). In some embodiments, the driver 600 is a data driver that applies data signals to the pixels.

A pixel defining layer 190 covers a portion of the pixel electrode 710 and is formed on the protective layer 180. The pixel defining layer 190 has an opening 199 exposing a portion the pixel electrode 710.

The pixel electrode 710 is forming in an area corresponding to the opening 199 in the pixel defining layer 190. The pixel defining layer 190 may be formed of polyacrylate resin, polyimide resin, or the like.

The organic light-emitting layer 720 is formed on the pixel electrode 710 in the opening 199 of the pixel defining layer 190 and the common electrode 730 is formed on the pixel defining layer 190 and the organic light-emitting layer 720.

As described above, the OLED 70 includes the pixel electrode 710, the organic light-emitting layer 720, and the common electrode 730.

The pixel electrode 710 or the common electrode 730 may be formed of a transparent conductive material and the other may be formed of transflective or reflective conductive material. According to the materials included in the pixel electrode 710 and the common electrode 730, an OLED display 900 can be classified into a top-emission type, a bottom-emission type, or a dual-emission type.

The transparent conductive material may include one or more material selected from the group of Iridium Tin Oxide (ITO), Indium Zinc Oxide (IZO), zinc oxide (ZnO), and indium oxide (In2O3). The reflective material may include one or more material selected from the group of lithium (Li), Calcium (Ca), lithium fluoride/Calcium (LiF/Ca), lithium fluoride/aluminum (LiF/Al), aluminum (Al), silver (Ag), magnesium (Mg), and gold (Au).

The organic light-emitting layer 720 may include a low molecular weight organic material or a high molecular weight organic material. Further, the organic light-emitting layer 720 may be formed to be a multilayer including at least one of an emission layer, hole injection layer (HIL), hole transporting layer (HTL), electron transporting layer (ETL), and electron injection layer (EIL). In some embodiments, the hole injection layer (HIL) is formed on the pixel electrode 710 serving as an anode, and the hole transporting layer (HTL), emission layer, electron transporting layer (ETL), and electron injection layer (EIL) are sequentially laminated on the hole injection layer (HIL).

According to some embodiments, the organic light-emitting layer 720 is formed only in the opening 199 of the pixel defining layer 190, but the described technology is not limited thereto. At least one layer of the organic light-emitting layer 720 can be formed between the pixel defining layer 190 and the common electrode 730 as well as on the pixel electrode 710 in the opening 199 of the pixel defining layer 190. In more detail, the hole injection layer (HIL), hole transporting layer (HTL), electron transporting layer (ETL), and electron injection layer (EIL) of the organic light-emitting layer 720 can also be formed on areas other than the opening 199 via deposition with an open mask, and the emission layer of the organic light-emitting layer 720 can be formed in each opening 199 via deposition with a fine metal mask (FMM).

Meanwhile, when the display device a liquid crystal display (LCD), the pixel electrode 710 is physically and electrically connected to the driving drain electrode 177 through the first contact hole 181 and receives a data voltage from the driving drain electrode 177. The pixel electrode 710 receiving the data voltage generates an electric field, together with the common electrode (not shown) receiving common voltage, thereby controlling the orientation of liquid crystal molecules included in a liquid crystal layer (not shown) between the two electrodes. The pixel electrode 710 and the common electrode form a capacitor (hereinafter referred to as a "liquid crystal capacitor") so as to maintain the applied voltage after a thin film transistor is turned off.

Hereinafter, a method of manufacturing an OLED display according to an embodiment will be described with reference to FIGS. 3 and 5A to 5F. Further description of the OLED display, which is previously described, will not be provided.

FIGS. 5A to 5F are cross-sectional views showing a method of manufacturing an OLED display according to an embodiment.

Figure 5A:
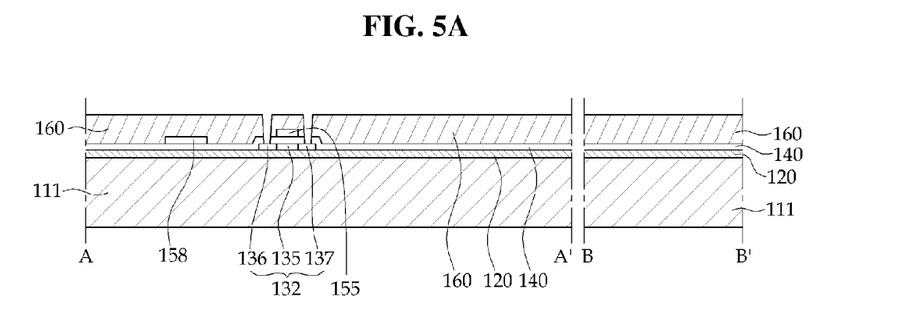
FIGS. 5A to 5F are cross-sectional views showing a method of manufacturing an OLED display according to an embodiment.

As illustrated in FIG. 5A, a substrate main body 111 including a display area and a pad area is prepared. A buffer layer 120 is formed on the substrate main body 111. Inorganic insulating materials, e.g., silicon nitride (SiNx), silicon oxide (SiO2), or the like, are deposited on the substrate main body 111 by a known deposition method such as plasma-enhanced chemical vapor deposition (PECVD) so as to form the buffer layer 120.

A driving semiconductor layer 132 is formed on the buffer layer 120. The driving semiconductor layer 132 may be formed by a photolithography process. A gate insulating layer 140 is formed on the driving semiconductor layer 132. The gate insulating layer 140 may include a silicon nitride layer and a tetraethyl orthosilicate (TEOS) layer on the silicon nitride layer. The above inorganic layers may be formed by a known method such as the PECVD.

A driving gate electrode 155, a gate line 151, and a first storage electrode 158 are formed on the gate insulating layer 140. An insulating layer 160 is formed on the driving gate electrode 155, the gate line 151, and the first storage electrode 158 and thereafter contact holes exposing a source area 136 and a drain area 137 of the driving semiconductor layer 132 are formed in the insulating layer 160. The insulating layer 160 may include one or more material selected from the group of tetraethyl orthosilicate (TEOS), silicon nitride (SiNx), and silicon oxide (SiOx) in the same way as the gate insulating layer 140, and may be formed by a known method such as the PECVD.

Figure 5B:
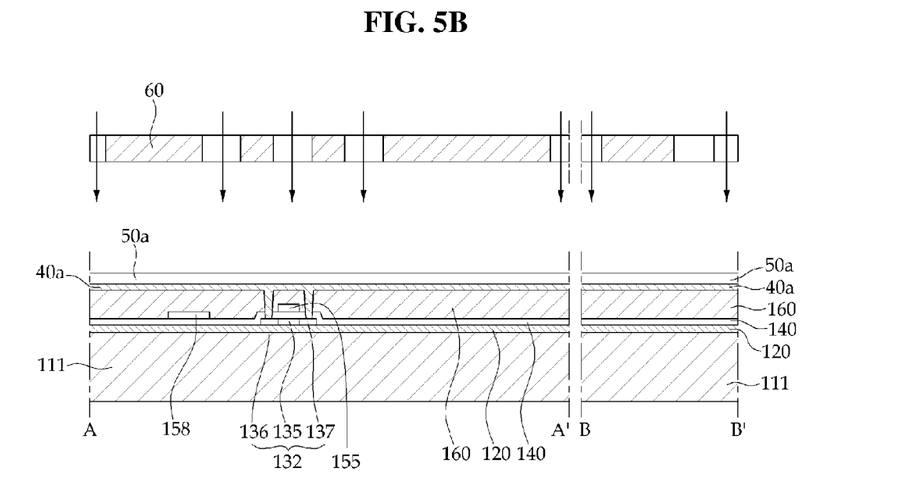

As illustrated in FIG. 5B, a metal layer 40*a* is coated on the insulating layer 160 and thereafter a photoresist 50*a* is coated on the metal layer 40*a*. According to some embodiments, the photoresist 50*a* has a thickness of about 1000 nm to about 2000 nm. The photoresist 50*a* is exposed to light by using a mask 60. However, in other embodiments, the photoresist 50*a* has a thickness of less than about 1000 nm or greater than about 2000 nm.

Figure 5C:
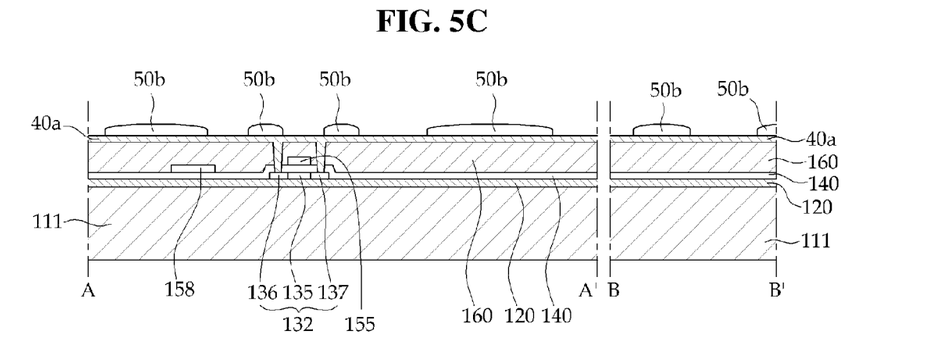

As illustrated in FIG. 5C, the photoresist 50*a* is developed to form a photoresist pattern 50*b*. The photoresist pattern 50*b* is formed in areas where a driving source electrode 176, a driving drain electrode 177, a data line 171, a common power source line 172, a second storage electrode 178, a pad electrode 400, and a pattern 500 will be formed.

Figure 5D:
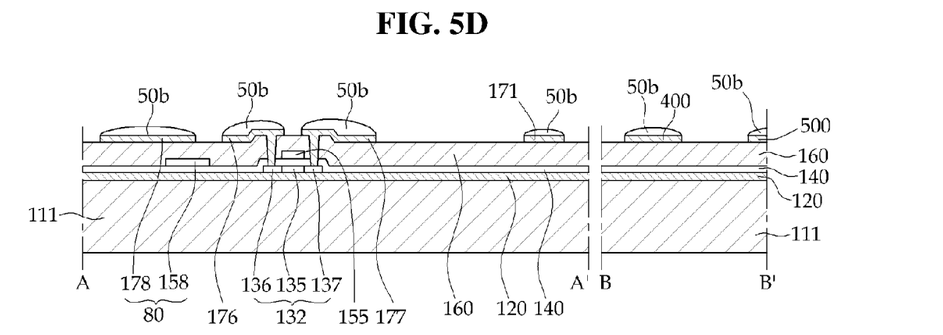

As illustrated in FIG. 5D, the metal layer 40*a* is etched via an etching process using the photoresist pattern 50*b* so as to form the driving source electrode 176, the driving drain electrode 177, the data line 171, the common power source line 172, the second storage electrode 178, the pad electrode 400, and the pattern 500.

Figure 5E:
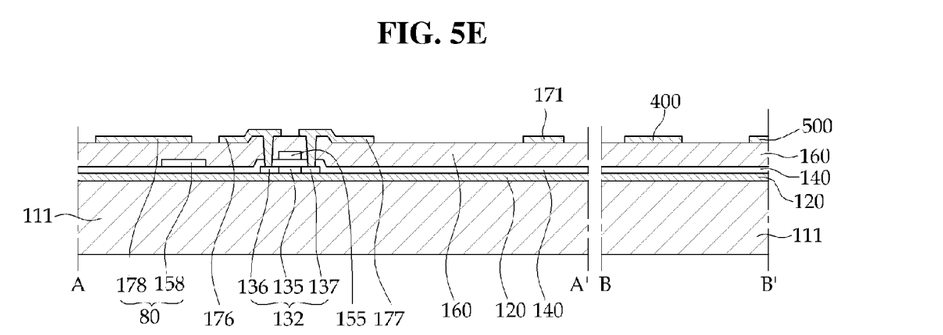

As illustrated in FIG. 5E, the photoresist pattern 50*b* is stripped by a dry etching or wet etching process using a plasma.

Figure 5F:
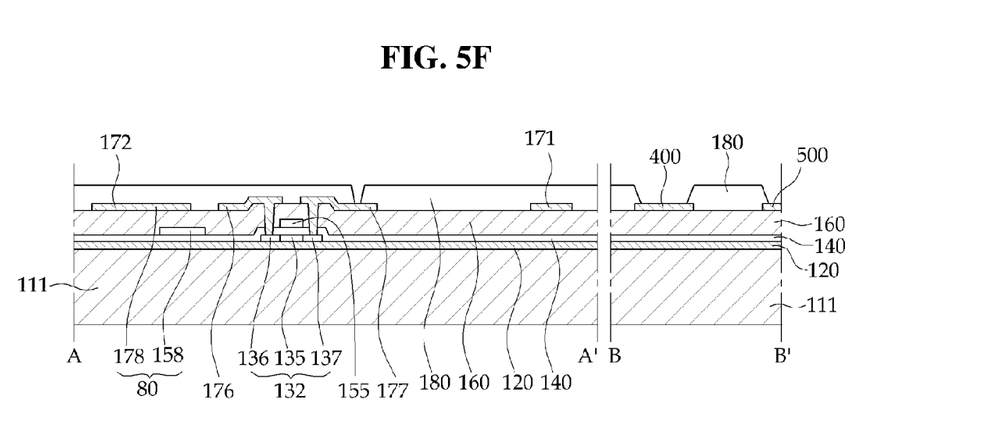

As illustrated in FIG. 5F, a protective layer 180 is formed on the driving source electrode 176, the driving drain electrode 177, the data line 171, the common power source line 172, the second storage electrode 178, and the pad electrode 400. In some embodiments, the protective layer 180 covers a portion of the pattern 500. A first contact hole exposing the driving drain electrode 177 and a second contact hole exposing the pad electrode 400 are formed in the protective layer 180.

As illustrated in FIG. 3, a pixel electrode 710 is formed on the protective layer 180 and thereafter a pixel defining layer 190, an organic light-emitting layer 720, and a common electrode 730 are sequentially formed.

Hereinafter, a display device according to another embodiment will be described with reference to FIG. 6. Only those configurations of the display device which are different from that of the previously described display device will be described below. Therefore, a pad area PA that is different from that of the previous embodiment will be discussed below.

Figure 6:
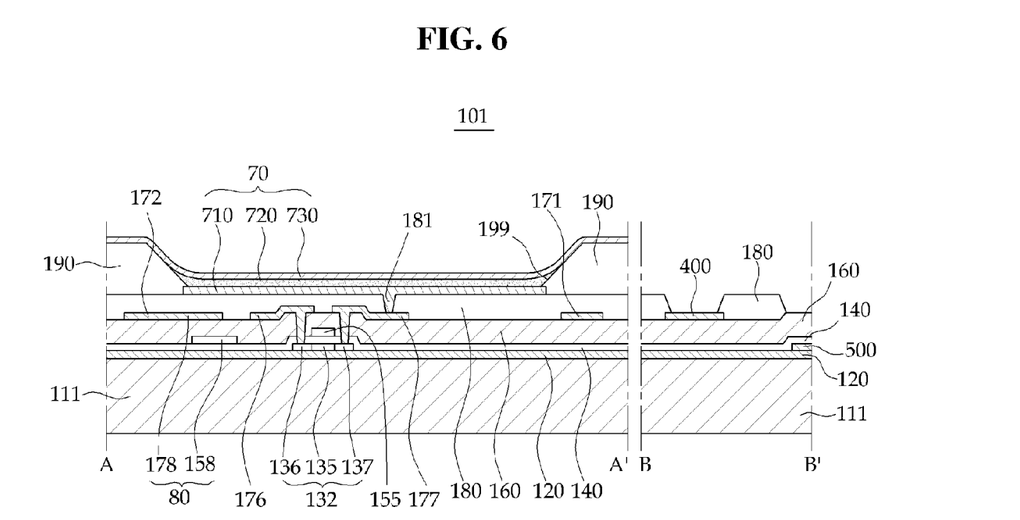
FIG. 6 is a cross-sectional view showing a display area, taken along line A-A' of FIG. 2, and a pad area, taken along line B-B' of FIG. 1 according to another embodiment.

FIG. 6 is cross-sectional views showing a display area, taken along line A-A' of FIG. 2, and a pad area, taken along line B-B' of FIG. 1 together, according to another embodiment.

A pattern 500 is formed on the buffer layer 120 in the pad area PA. The pattern 500 may be formed by the same process as the driving semiconductor layer 132 of the display area DA and may be formed of the same material and on the same layer.

A gate insulating layer 140 is formed on the pattern 500 in the pad area PA. The gate insulating layer 140 protrudes from the buffer layer farther in an area corresponding to the area where the pattern 500 is formed.

An insulating layer 160 is formed on the gate insulating layer 140 in the pad area PA. The insulating layer 160 of the pad area PA also protrudes farther over the pattern 500.

The protrusion of the insulating layer 160 performs the same function as the pattern 500 of the previous embodiment. In other words, the penetration of moisture from the side and lifting phenomenon of the protective layer 180 are substantially prevented due to the configuration of the protective layer 180 and the protrusion of the insulating layer 160.

When the pattern 500 is not formed, a step is formed at an end portion of the insulating layer 160 due to the protective layer 180, thereby causing the penetration of moisture between the protective layer 180 and insulating layer 160 and lifting of the protective layer 180 from the insulating layer. However, these problems can be prevented by forming the protrusion in the insulating layer 160.

From the foregoing, it will be appreciated that various embodiments of the invention have been described herein for purposes of illustration, and that various modifications may be made without departing from the scope and spirit of the invention. Accordingly, the various embodiments disclosed herein are not intended to be limiting, with the true scope and spirit being indicated by the following claims, and equivalents thereof.

What is claimed is:

1. A display device, comprising:
   a substrate including a display area and a pad area;
   a semiconductor layer formed over the substrate;
   an insulating layer formed over the semiconductor layer;
   a metal wire formed over the insulating layer in the display area;
   a pad electrode formed over the insulating layer in the pad area, wherein the pad electrode is electrically connected to the metal wire; and
   a pattern formed between an edge of the substrate and an end portion of the pad electrode,
   wherein the edge of the substrate is adjacent to the pad electrodes,
   wherein the pattern is spaced apart from the end portion of the pad electrode, and
   wherein the pattern is electrically insulated from the pad electrode.

2. The display device of claim 1, wherein the pattern is formed on the insulating layer.

3. The display device of claim 2, further comprising a protective layer formed over the metal wire and the pad electrode, wherein the protective layer covers at least a portion of the pattern.

4. The display device of claim 3, wherein the metal wire, the pad electrode, and the pattern are formed on the same layer.

5. The display device of claim 3, wherein the protective layer has a contact hole at least partially overlapping the pad electrode.

6. The display device of claim 5, further comprising:
   a pixel circuit;
   a driver formed over the protective layer and electrically connected to the pad electrode via the contact hole, wherein the driver is configured to drive the pixel circuit; and
   an anisotropic conductive film interposed between the protective layer and the driver.

7. The display device of claim 1, wherein the pattern and the semiconductor layer are formed on the same layer.

8. The display device of claim 7, wherein the insulating layer comprises a protrusion in an area overlapping the pattern.

9. The display device of claim 8, further comprising a protective layer formed over the metal wire and the pad electrode, wherein the protective layer covers a portion of the protrusion.

10. The display device of claim 1, wherein the pattern has a substantially line shape.

11. The display device of claim 1, wherein the pattern extends along the edge of the substrate.

12. The display device of claim 1, wherein the metal wire comprises one or more of a source electrode, a drain electrode, a storage electrode, and a data line.

13. An organic light-emitting diode (OLED) display, comprising:
- a substrate including a display area and a pad area;
- a plurality of pixels formed in the display area, each pixel comprising a thin film transistor (TFT) and an OLED;
- an insulating layer formed in the display area and the pad area;
- a plurality of pad electrodes formed over the insulating layer in the pad area and electrically connected to the TFTs; and
- a spacer formed closer to an edge of the substrate than the pad electrodes,
- wherein the edge of the substrate is adjacent to the pad electrodes, and
- wherein the spacer is electrically insulated from the pad electrodes.

14. The OLED display of claim 13, wherein the insulating layer is formed over the spacer so as to form a protrusion in the insulating layer.

15. The OLED display of claim 13, wherein the spacer has a substantially line shape.

* * * * *